United States Patent [19]
Doan et al.

[11] Patent Number: 6,150,253
[45] Date of Patent: Nov. 21, 2000

[54] CONTROLLABLE OVONIC PHASE-CHANGE SEMICONDUCTOR MEMORY DEVICE AND METHODS OF FABRICATING THE SAME

[75] Inventors: Trung T. Doan; D. Mark Durcan; Brent D. Gilgen, all of Boise, Id.

[73] Assignee: Micron Technology, Inc., Boise, Id.

[21] Appl. No.: 08/956,594

[22] Filed: Oct. 23, 1997

Related U.S. Application Data

[63] Continuation-in-part of application No. 08/724,816, Oct. 2, 1996.
[51] Int. Cl.$^7$ ...................................................... H01L 21/44
[52] U.S. Cl. ............................ 438/597; 438/120; 438/95; 438/625; 437/195
[58] Field of Search ..................................... 438/120, 637, 438/625, 95, 597; 437/195

[56] References Cited

U.S. PATENT DOCUMENTS 5,296,716   3/1994   Ovshinsky et al. .
5,789,277   8/1998   Zahorik et al. ............................ 438/95
5,879,955   3/1995   Gonzaler et al. ......................... 437/195

*Primary Examiner*—David Nelms
*Assistant Examiner*—Pho Luu
*Attorney, Agent, or Firm*—Trask Britt

[57] ABSTRACT

An ovonic phase-change semiconductor memory device having a reduced area of contact between electrodes of chalcogenide memories, and methods of forming the same. Such memory devices are formed by forming a tip protruding from a lower surface of a lower electrode element. An insulative material is applied over the lower electrode such that an upper surface of the tip is exposed. A chalcogenide material and an upper electrode are either formed atop the tip, or the tip is etched into the insulative material and the chalcogenide material and upper electrode are deposited within the recess. This allows the memory cells to be made smaller and allows the overall power requirements for the memory cell to be minimized.

9 Claims, 16 Drawing Sheets

CONTROLLABLE OVONIC PHASE-CHANGE SEMICONDUCTOR MEMORY DEVICE AND METHODS OF FABRICATING THE SAME

RELATED APPLICATIONS

The present application is a continuation-in-part of U.S. patent application Ser. No. 08/724,816, filed Oct. 2, 1996.

BACKGROUND OF THE INVENTION

1. Field of the Invention

The present invention relates generally to semiconductor fabrication techniques and, more particularly, to a method for fabricating a small contact area between an upper and lower electrode for use in phase changeable ("ovonic") memory devices such as, for example, chalcogenide memory cells.

2. State of the Art

The use of electrically writeable and erasable phase change materials, i.e., materials that can be electrically switched between generally amorphous and generally crystalline states or between different resistive states while in crystalline form, for electronic memory applications is well known in the art. The use of phase change materials is disclosed, for example, in U.S. Pat. No. 5,296,716, in the names of Ovshinsky et al. ("the Ovshinsky patent"), the disclosure of which is incorporated herein by reference. The Ovshinsky patent is believed to indicate generally the state of the art, and to contain a discussion of the current theory of operation of chalcogenide materials.

Generally, as disclosed in the Ovshinsky patent, such phase change materials can be electrically switched between a first structural state where the material is generally amorphous and a second structural state where the material has a generally crystalline local order. The material may also be electrically switched between different detectable states of local order across the entire spectrum between the completely amorphous and the completely crystalline states. That is, the switching of such materials is not required to take place between completely amorphous and completely crystalline states, but rather, the material can be switched in incremental steps reflecting changes of local order to provide a "gray scale" represented by a multiplicity of conditions of local order spanning the spectrum from the completely amorphous state to the completely crystalline state. Materials with such properties are known as "ovonic" materials.

Chalcogenide material exhibits different electrical characteristics depending upon its state. For example, in its amorphous state, the material exhibits lower electrical conductivity than it does in its crystalline state. The operation of chalcogenide memory cells requires that a region of the chalcogenide memory material, called the chalcogenide active region, be subjected to a current pulse typically with a current density between about $10^5$ and $10^7$ amperes/cm$^2$ to change the crystalline state of the chalcogenide material within the active region contained within a small pore. This current density may be accomplished by first creating a small opening in a dielectric material that is itself deposited onto a lower electrode material. A second dielectric layer, typically of silicon nitride, is then deposited onto the dielectric layer into the opening. The second dielectric layer is typically about 40 Angstroms thick. The chalcogenide material is then deposited over the second dielectric layer and into the opening. An upper electrode material is then deposited over the chalcogenide material. Carbon is commonly used as the electrode material, although other materials have also been used, for example, molybdenum and titanium nitride. A conductive path is then provided from the chalcogenide material to the lower electrode material by forming a pore in the second dielectric layer by a well-known firing process.

Firing involves passing an initial high current pulse through the structure, such that the pulse passes through the chalcogenide material and effecting dielectric breakdown of the second dielectric layer to provide a conductive path via the pore created through the memory cell. However, electrically firing the thin nitride layer is not desirable for a high density (i.e., high number of memory cells) memory product due to the high current required the large amount of testing time required for the firing.

The active regions of the chalcogenide memory cells within the pores are believed to change crystalline structure in response to applied voltage pulses of a wide range of magnitudes and pulse durations. These changes in crystalline structure alter the bulk resistance of the chalcogenide active region. The wide dynamic range of these devices, the linearity of their response, and lack of hysteresis provide these memory cells with multiple bit storage capabilities.

Factors such as pore dimensions (i.e., diameter, thickness and volume), chalcogenide composition, signal pulse duration and signal pulse waveform shape have an effect on the magnitude of the dynamic range of resistances, the absolute endpoint resistances of the dynamic range, and the currents required to set the memory cells at these resistances. For example, relatively large pore diameters, e.g., about one micron, will result in higher programming current requirements, while relatively small pore diameters, e.g., about 500 Angstroms, will result in lower programming current requirements. The most important factor in reducing the required programming current is limiting the pore cross sectional area.

The energy input required to adjust the crystalline state of the chalcogenide active region of the memory cell is directly proportional to the dimensions of the minimum cross-sectional dimension of the pore, e.g., smaller pore sizes result in smaller energy input requirements. Conventional chalcogenide memory cell fabrication techniques provide minimum cross-sectional pore dimension, diameter or width of the pore, that is limited by the photolithographic size limit. This results in pore sizes having minimum lateral dimensions down to approximately 0.35 microns. However, further reduction in pore size is desirable to achieve improved current density for writing to the memory cell.

SUMMARY OF THE INVENTION

The present invention includes a controllable ovonic phase-change semiconductor memory device having a small contact area between electrodes of chalcogenide memory cells of a minimum cross-sectional dimension below that achievable with existing photolithographic techniques, which device has a reduced energy input demand to operate the chalcogenide active region. The memory cell electrodes of the device are further selected to provide material properties that permit enhanced control of the current passing through the chalcogenide memory cell. As a result of the reduced chalcogenide contact area, the memory cells may be made smaller to provide denser memory arrays, and the overall power requirements for the memory cells are minimized. Methods of fabricating the memory device of the invention are also contemplated as yet another aspect of the invention.

Additional advantages of the invention will be set forth in part in the description that follows, and in part will be obvious from the description, or may be learned by practice of the invention.

In accordance with one purpose of the invention, as embodied and broadly described herein, the invention comprises a method of manufacturing a semiconductor device comprising the steps of providing a conductive layer on a substrate; patterning the conductive layer to form a raised portion of the conductive layer; providing an insulating layer on the conductive layer including the raised portion; and selectively removing a portion of the insulative layer to expose part of the raised portion of the conductive layer.

In another aspect, the present invention comprises an integrated circuit device comprising: a substrate having a primary surface; a conductive layer provided on the primary surface, the conductive layer having a raised portion; an insulative layer overlying the first conductive layer and exposing part of the raised portion; and a layer of programmable resistive material provided in contact with the exposed part of the raised portion of the first conductive layer, the exposed part of the raised portion being of a smaller cross-sectional area than the remaining part of the raised portion of the first conductive layer.

In still another aspect, the present invention comprises an integrated circuit comprising: a first electrode having a first portion and a second portion, a width of the first electrode narrowing substantially continuously in a direction extending from the second portion toward the first portion of the first electrode; a layer of programmable resistive material provided in contact with the first electrode; and a second electrode coupled to the layer of programmable resistive material.

In yet another aspect, the present invention comprises an integrated circuit device comprising: a substrate having a primary surface; a conductive layer provided on the primary surface, the conductive layer having a raised portion; an insulative layer overlying the first conductive layer and exposing part of the raised portion; a recess in the insulative layer above the raised portion; and a layer of programmable resistive material provided in contact with the exposed part of the raised portion in the recess.

In still another aspect, the present invention comprises an integrated circuit comprising: a first electrode having a first portion and a second portion, a width of the first electrode narrowing substantially continuously in a direction from the second portion toward the first portion of the first electrode; a layer of programmable resistive material provided in a recess formed in an insulative material over the first electrode, wherein the programmable resistive material layer is in contact with the first electrode; and a second electrode coupled to the layer of programmable resistive material.

It is to be understood that both the foregoing general description and the following detailed description are exemplary and explanatory only and are not restrictive of the invention, as claimed.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

A method of fabricating a small area of contact between electrodes of chalcogenide memories is presented that provides an area of contact with the lower electrode by the upper electrode, via the chalcogenide material, that is smaller than that presently producible using conventional photolithographic techniques. In particular, the preferred embodiment of the present invention provides a method of fabricating electrodes for chalcogenide memories in which an area of contact of the lower electrode with the upper electrode is minimized by forming a tip or protrusion extending from a surface of the lower electrode. In this manner, the lower electrode having a minimum area of contact as small as $\pi \times (0.05 \,\mu m)^2$ is obtained. An insulative material is applied over the lower electrode in a manner such that an upper surface of the tip is exposed, while the surrounding surface of the lower electrode remains covered. The chalcogenide material and upper electrode are either formed atop the tip, or the tip is etched to form a recess in the insulative material and the chalcogenide material and upper electrode are deposited therein as successive layers. The present invention provides enhanced control of the current passing through the resulting chalcogenide memory, and thus reduces the total current and energy input required to the chalcogenide active region in operation. The total current passing through the chalcogenide active region is two milliamps (mA). Thus, the current density required by the preferred embodiment is $1 \times 10^6$ A/cm$^2$ to $1 \times 10^7$ A/cm$^2$. Furthermore, the structure of the preferred embodiment allows the memory cells to be made smaller than that in the prior art and thus facilitates the production of denser memory arrays, and allows the overall power requirements for memory cells to be minimized.

Reference will now be made in detail to the presently preferred embodiment of the invention, an example of which is illustrated in the accompanying drawings. Wherever possible, the same reference numbers will be used throughout the drawings to refer to the same or equivalent elements.

It should be understood that the illustrations in FIGS. 1–23 do not comprise actual views of any particular semiconductor device, but merely are idealized representations which are employed to more clearly and fully depict the process and structure of the invention than would otherwise be possible.

Figure 1:
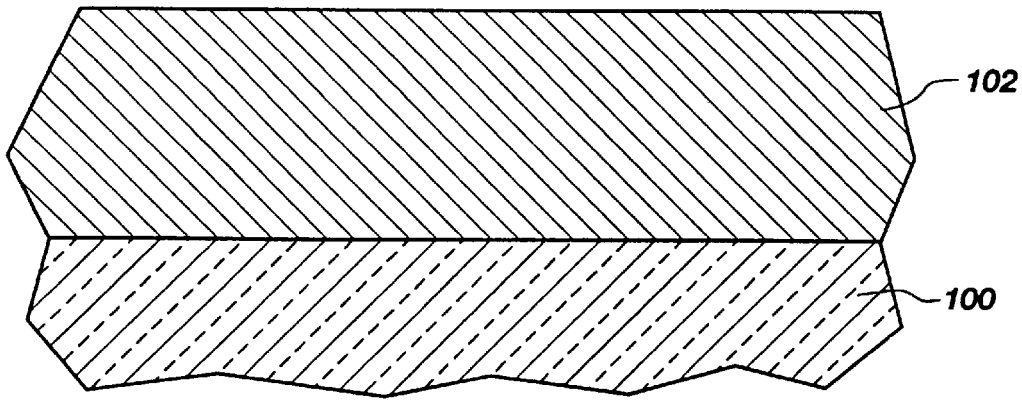
FIG. 1 is a side cross-sectional view of the deposition of a layer of polysilicon onto a substrate of titanium nitride in accordance with a preferred embodiment of the present invention.

Turning to the drawings and referring to FIGS. 1 to 15, a method for fabricating a small area of contact between an upper and lower electrode for chalcogenide memories will now be described. A layer of conductive material 102, preferably polysilicon, is deposited onto a substrate 100 using conventional thin film deposition methods such as, for example, chemical vapor deposition (CVD), as illustrated in FIG. 1. The conductive material layer 102 may have a substantially uniform thickness ranging from about 5000 to 7000 Angstroms, and preferably will have a substantially uniform thickness of approximately 6500 Angstroms. The substrate 100 may also comprise a conductive material such as, for example, silicon, tin, carbon, WSi$_x$, or tungsten, and preferably will comprise silicon. The substrate 100 will further preferably comprise a lower electrode grid (not shown) used for accessing an array of chalcogenide memories.

Figure 2:
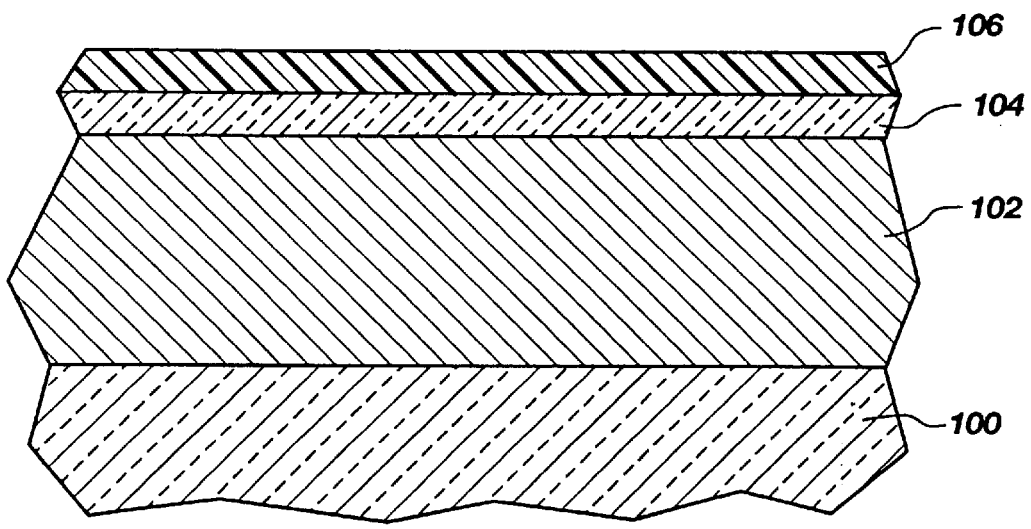
FIG. 2 is a side cross-sectional view of the deposition of a layer of silicon oxide and a layer of resist material onto the layer of polysilicon.

A layer of silicon oxide 104 is deposited onto the substrate 100, preferably by CVD, and will preferably have a thickness of about 500 Angstroms. A layer of resist material 106 is applied onto the silicon oxide layer 104, as illustrated in FIG. 2. The resist material layer 106 will preferably have a substantially uniform thickness of approximately 15,000 Angstroms.

Figure 3:
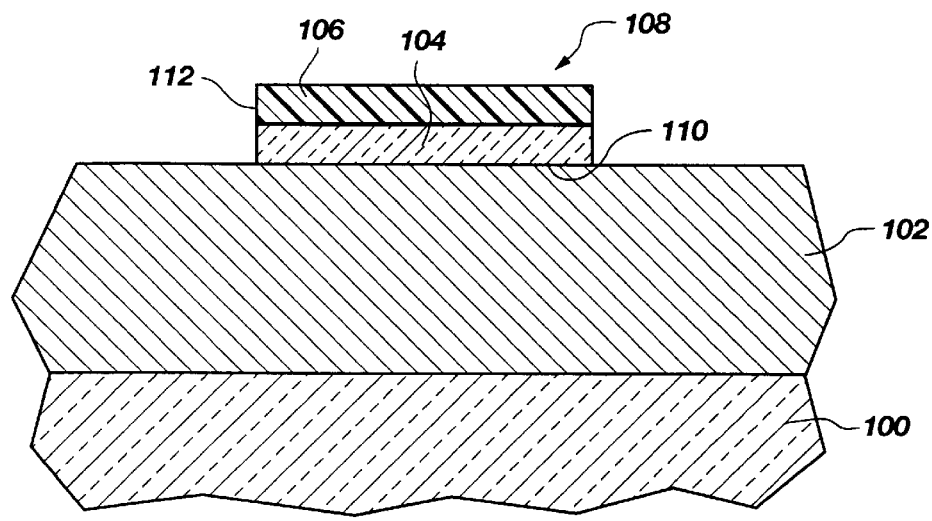
FIG. 3 is a side cross-sectional view of a contact pattern that is etched in the layer of resist material and the silicon oxide layer using etching, masking, and photoresist stripping techniques.
Figure 4A:
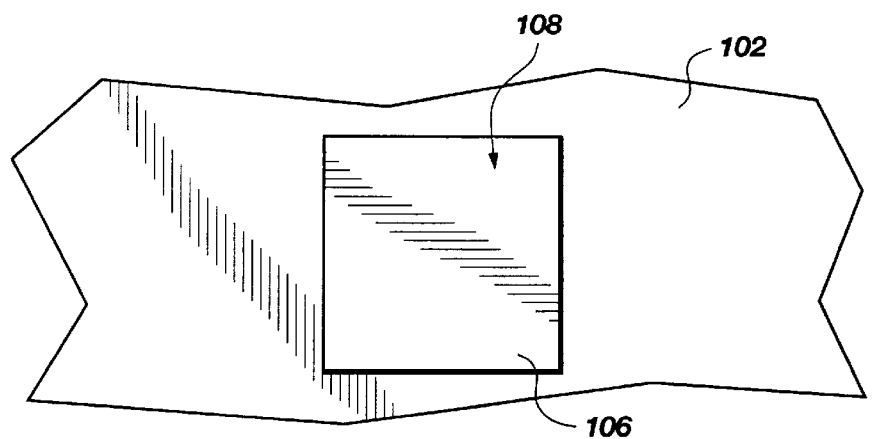
FIG. 4(a) is a top plan view of a generally rectangular contact pattern formed from the resist material and silicon oxide layers.
Figure 4B:
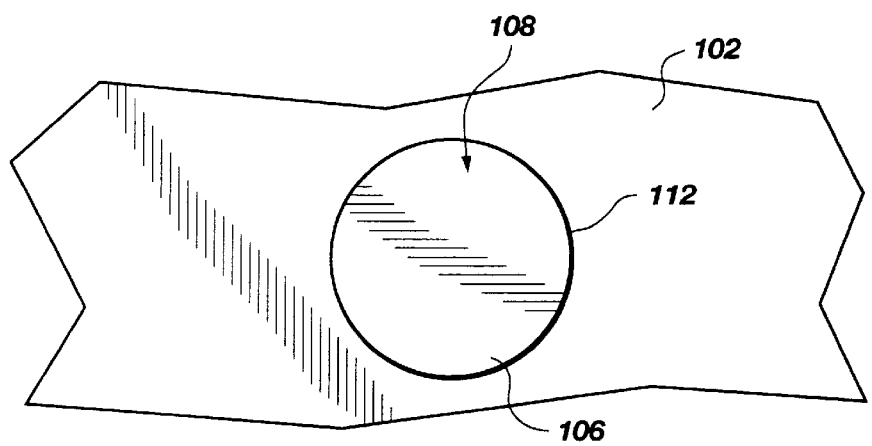
FIG. 4(b) is a top plan view of a generally circular contact pattern formed from the resist material and silicon oxide layers.

A contact pattern 108 is then etched in the resist material layer 106 and the silicon oxide layer 104 using conventional masking, exposing, etching, and photoresist stripping techniques, as shown in FIG. 3. The contact pattern 108 may be defined from the resist material layer 106 and silicon oxide layer 104, for example, as a generally rectangular block as shown in FIG. 4(a), or as a substantially circular block as shown in FIG. 4(b). The contact pattern 108 is preferably formed using a conventional contact hole mask, resulting in the substantially circular block shown in FIG. 4(b). The minimum lateral dimension of the contact pattern 108 preferably will be approximately 0.4 $\mu$m. The contact pattern 108 (see FIG. 3) includes a generally horizontal bottom surface 110 common to the conductive material layer 102, and generally vertical side walls 112 at its outer periphery.

Figure 5:
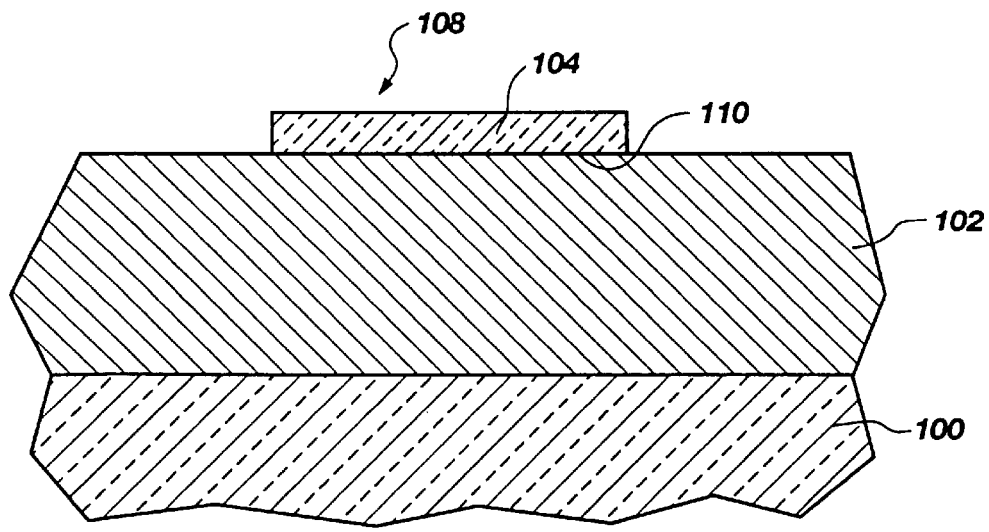
FIG. 5 is a side cross-sectional view of the device after the resist material layer has been stripped away using strip etching techniques.

After the contact pattern 108 has been patterned in the silicon oxide layer 104, the resist material layer 106 is then removed using conventional stripping techniques, as shown in FIG. 5. Thus, the silicon oxide layer 104 remains as the contact pattern 108. The silicon oxide layer 104 contact pattern is used as a masking layer when the conductive material layer 102 is subsequently etched.

Figure 6:
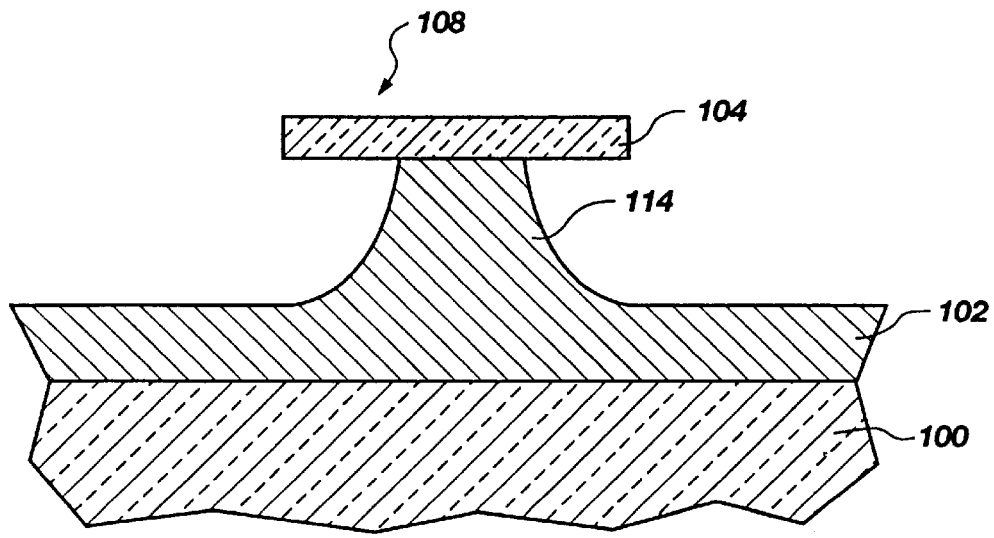
FIG. 6 is a side cross-sectional view of a portion of the layer of polysilicon material not covered by the silicon oxide layer pattern that is etched using conventional undercut isotropic etching techniques to form a frusto-conical shaped tip in the layer of polysilicon material.
Figure 7:
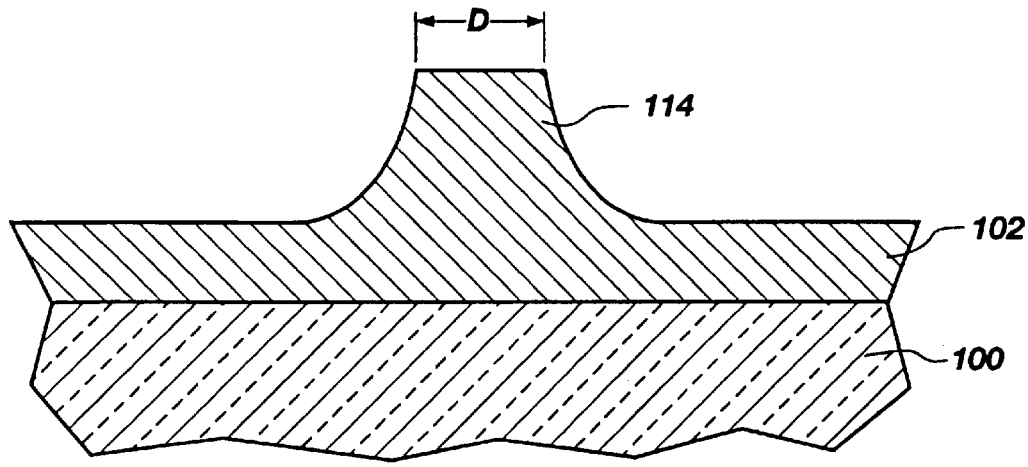
FIG. 7 is a side cross-sectional view of the device after the contact pattern has been removed using conventional wet etch techniques.

The portion of the conductive material layer 102 not covered by silicon oxide layer pattern 104 is etched using wet etch or dry plasma etching techniques. The portions of conductive material layer 102 beneath silicon oxide pattern 104 being undercut to form a frusto-conical shaped tip or protrusion 114 above the remaining exposed surface of the conductive material layer 102, as shown in FIG. 6. The frusto-conical tip 114 preferably has a minimum frustum lateral dimension D of approximately 0.1 μm. The base of the tip 114 preferably will have a base minimum lateral dimension of approximately 0.4 μm, i.e., the same dimension as the lateral dimension of the contact pattern 108. The tip 114 will preferably have a height of approximately 2000 Angstroms. The removal of the silicon oxide layer pattern 104 is accomplished using conventional wet etch techniques, as shown in FIG. 7. The contact pattern 108 thus provides a means for defining the area of contact of the base of the frusto-conical tip 114 of the conductive material layer 102 of about 0.00785 μm² [π×(0.05 μm)²]. Although the above dimensions are given as "preferred", it is understood that goal of the present invention is form the tip 114 as small as possible while maintaining uniformity and dimensional control.

Figure 8:
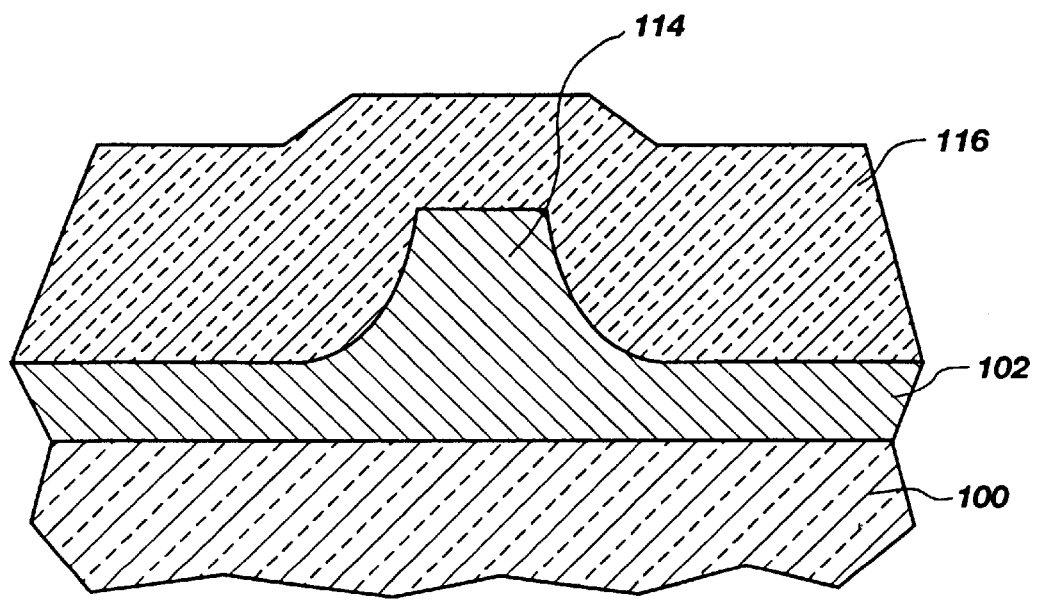
FIG. 8 is a side cross-sectional view of the depositing of a layer of insulative material onto the layer of polysilicon material, including the tip, using conventional thin film deposition methods to isolate the layer of polysilicon material, including the tip.

A layer of insulative material 116 is deposited onto the conductive material layer 102, including the tip 114, using conventional thin film deposition methods such as, for example, CVD, to isolate the conductive material layer 102, including the tip 114, as illustrated in FIG. 8. The insulative material layer 116 may have a substantially uniform thickness of approximately 2000 to 5000 Angstroms, and preferably will have a substantially uniform thickness of approximately 2000 Angstroms, i.e., the same thickness as the height of the tip 114. The insulative material layer 116 may comprise silicon oxide or silicon nitride, and preferably will comprise silicon oxide.

Figure 9:
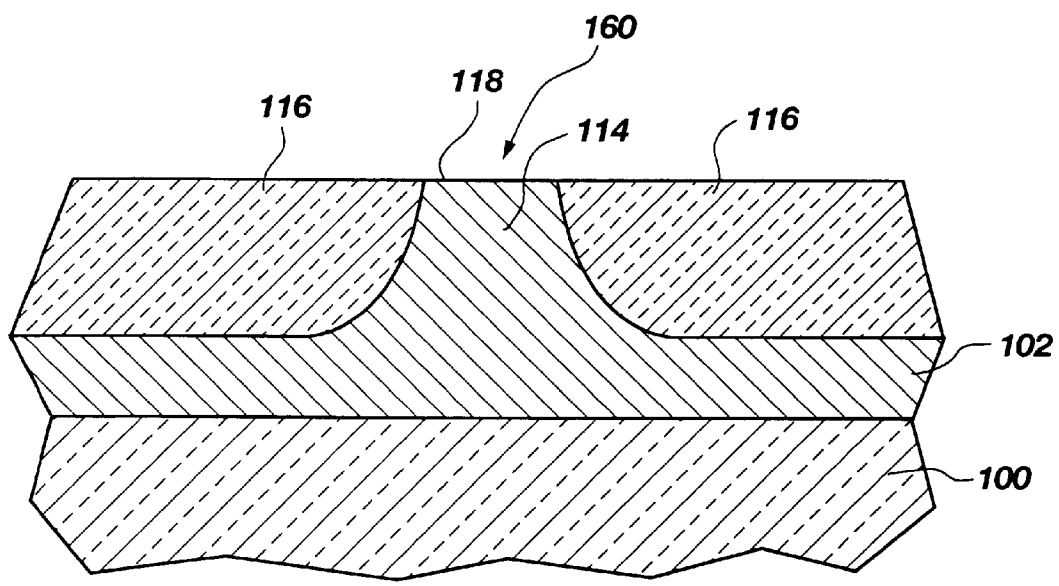
FIG. 9 is a side cross-sectional view of planarization of the layer of insulative material using a conventional chemical mechanical planarization (CMP) process.

The insulative material layer 116 is then preferably planarized using a conventional abrasive technique such as a chemical mechanical planarization (CMP) process, as illustrated in FIG. 9, to form an intermediate structure 160. The CMP process is performed to expose a top surface 118 of the tip 114 formed on the conductive material layer 102 that may also be referred to as the lower electrode.

Figure 15:
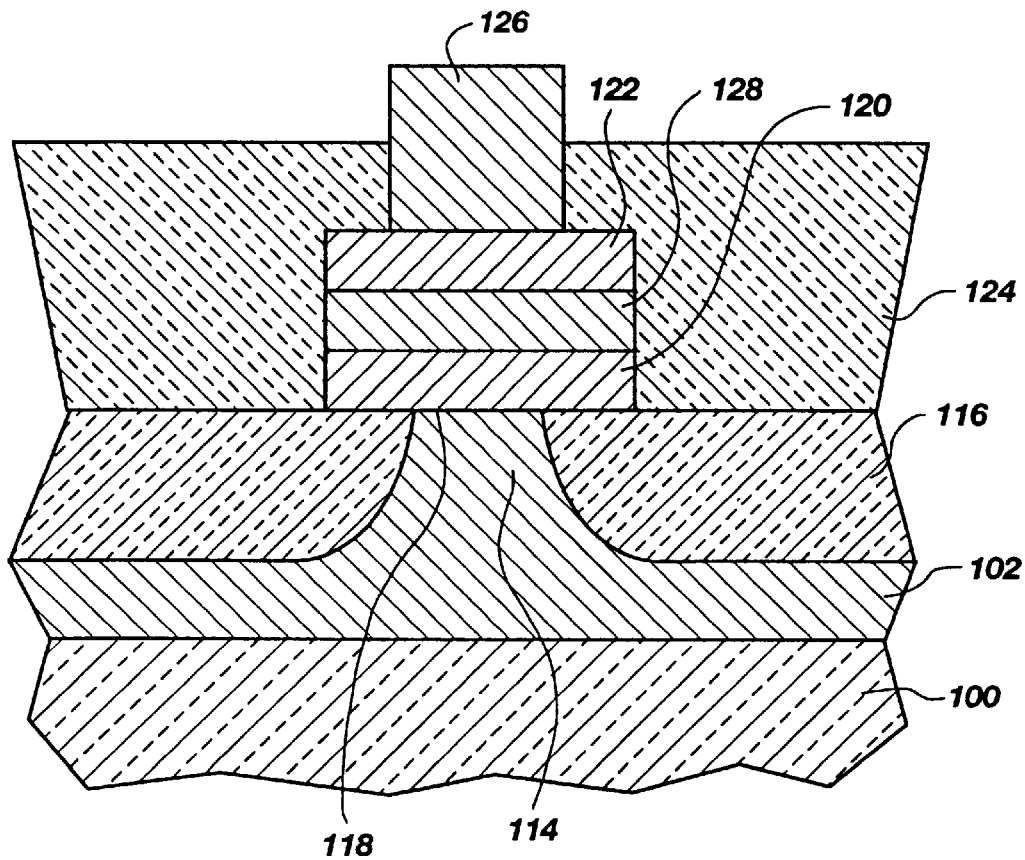
FIG. 15 is a side cross-sectional view of the complete chalcogenide memory cell including an upper conductive grid layer.

The chalcogenide memory cell is then formed by incorporating the tip 114 of the conductive material layer 102 using conventional semiconductor processing techniques such as, for example, thin-film deposition, masking, and etching processes. As shown in FIG. 15, the chalcogenide memory cell preferably includes a base layer of chalcogenide material 120, an interlayer dielectric (ILD) layer 124, an optional conductive barrier layer 128, a second layer of conductive material 122 serving as an upper electrode, and an upper conductive grid interconnect 126.

Figure 10:
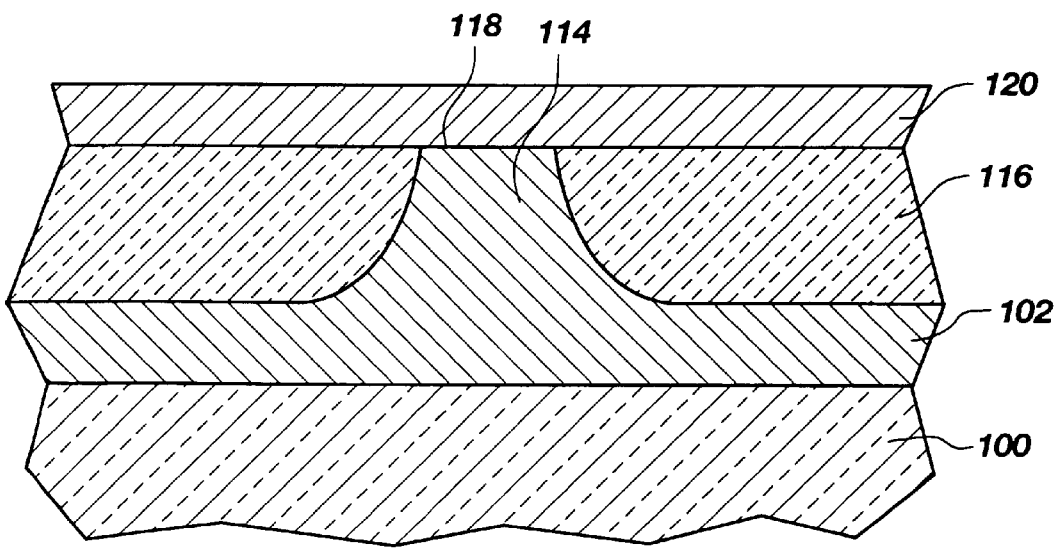
FIG. 10 is a side cross-sectional view of a chalcogenide material layer that is deposited using conventional thin film deposition methods.

The chalcogenide material layer 120 may be deposited using conventional thin film deposition methods, as shown in FIG. 10. The chalcogenide material layer 120 preferably is approximately 500 Angstroms thick. Typical chalcogenide compositions for these memory cells are alloys of tellurium (Te), germanium (Ge), and antimony (Sb). Such alloys include average concentrations of Te in the amorphous state well below 70%, typically below about 60% and ranging in general from as low as about 23% up to about 56% Te, and most preferably to about 48% to 56% Te; concentrations of Ge typically above about 15% and preferably range from a low of about 17% to about 44% on average, and remain generally below 50% Ge, with the remainder of the principal constituent elements in this class being Sb. The percentages are atomic percentages which total 100% of the atoms of the constituent elements. In a particularly preferred embodiment, the chalcogenide compositions for these memory cells comprise a Te concentration of 56%, a Ge concentration of 22%, and an Sb concentration of 22%. The materials are typically characterized as $Te_aGe_bSb_{100-(a+b)}$, where a is equal to or less than about 70% and preferably between about 40% and about 60%, b is above about 15% and less than 50%, and preferably between about 17% and 44%, and the remainder is Sb.

Figure 11:
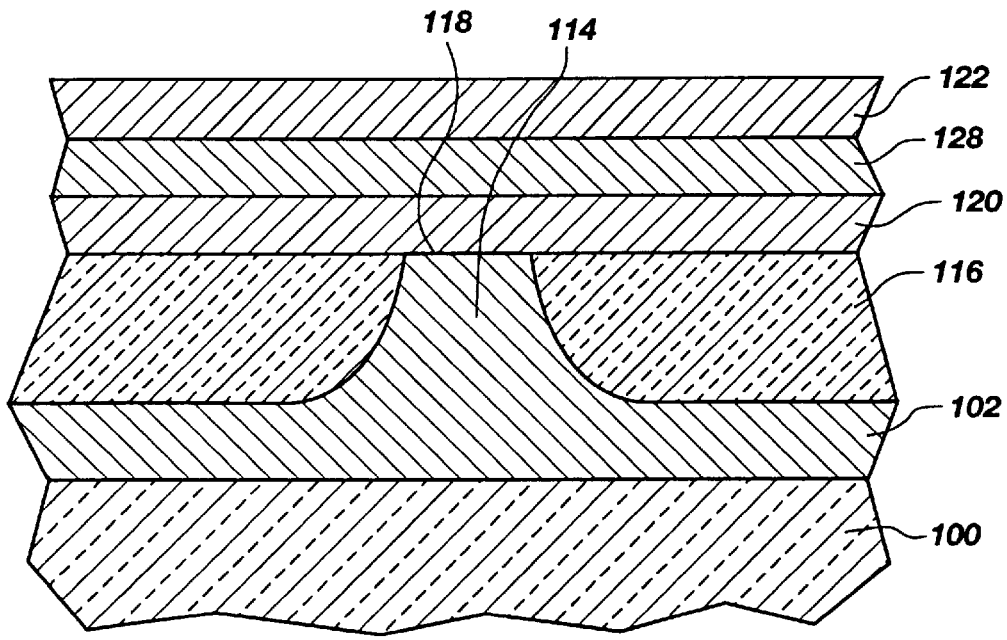
FIG. 11 is a side cross-sectional view of a layer of conductive material deposited over the chalcogenide layer using conventional thin film deposition techniques.

An optional conductive barrier layer 128 may be provided over the chalcogenide material layer 120 using conventional thin film deposition techniques, as shown in FIG. 11. The second conductive material layer 122 is deposited over the optional conductive barrier layer 128 using conventional deposition techniques, as further shown in FIG. 11. The optional conductive barrier layer 128 is disposed between the chalcogenide material layer 120 and the second conductive material layer 122 when these layers are made of such materials which will diffuse into one another. The optional conductive barrier layer 128 prevents such diffusion. Although carbon is a preferred material to form the optional barrier layer 128, numerous conductive materials and metals known in the art may be used.

Figure 12:
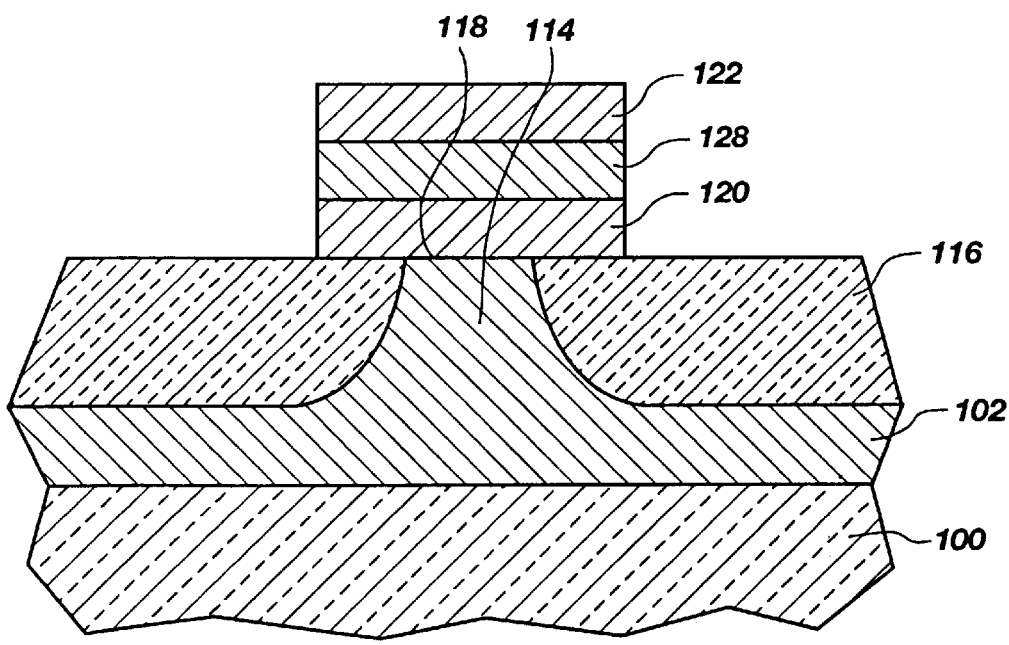
FIG. 12 is a side cross-sectional view of the layer of chalcogenide material and the second layer of conductive material after they are etched back using conventional masking and etching techniques.

The second conductive material layer 122 provides an upper electrode for the chalcogenide memory cell. The second conductive material layer 122 is preferably titanium nitride (TiN), but may comprise TiN or carbon, and has a thickness of approximately 500 Angstroms. Layers 120,122, and 128 are subsequently etched using conventional masking and etching techniques, as shown in FIG. 12.

Figure 13:
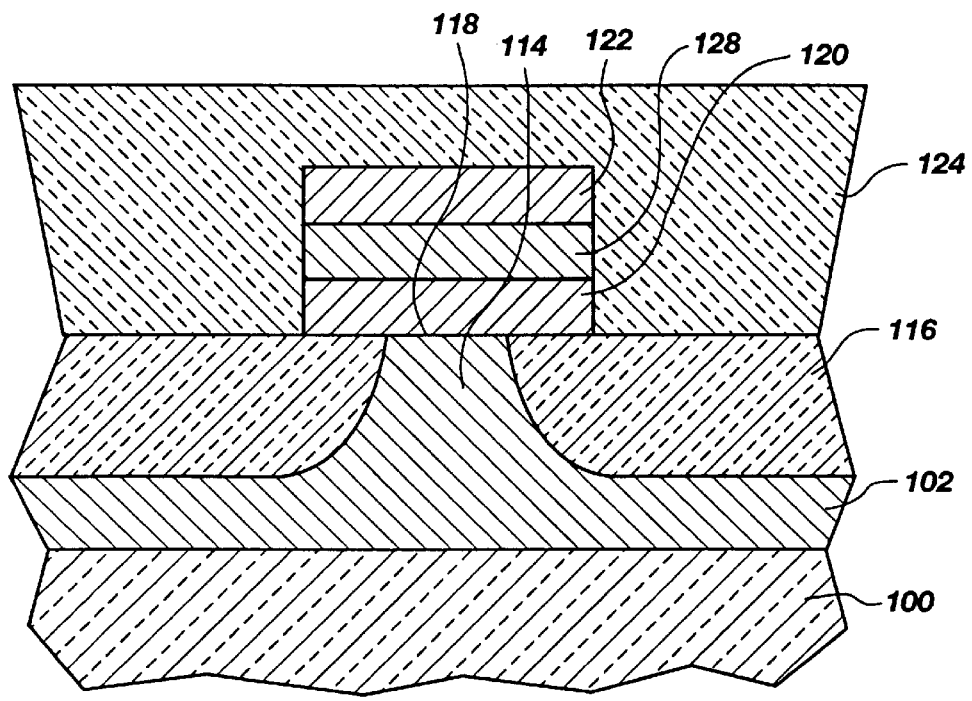
FIG. 13 is a side cross-sectional view of a second layer of insulative material that is applied using conventional thin film deposition techniques.
Figure 14:
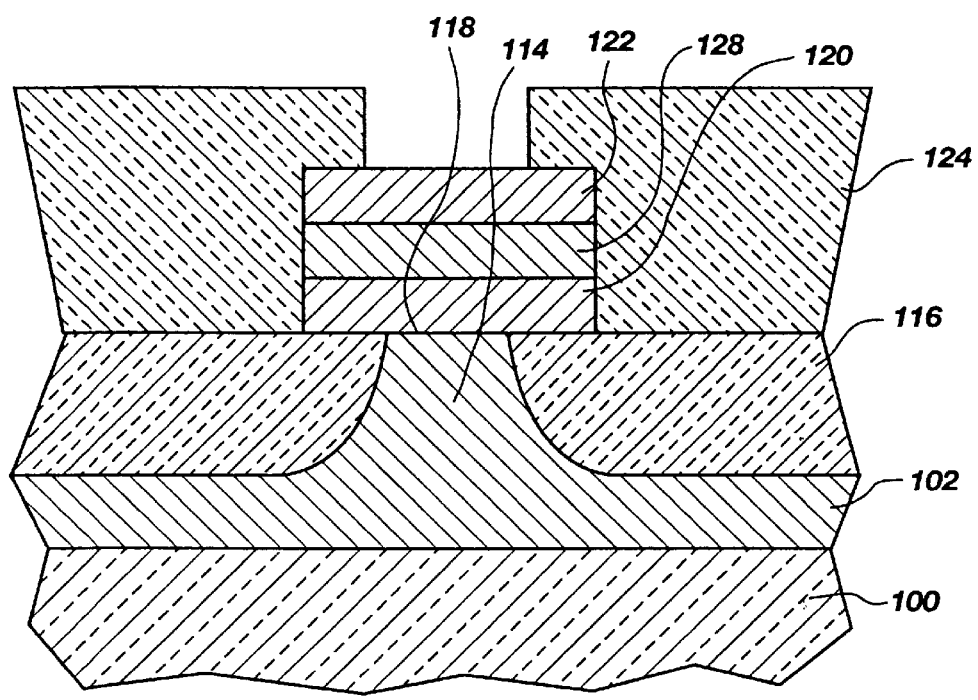
FIG. 14 is a side cross-sectional view of the second layer of insulating material after it is etched back.

As shown in FIG. 13, the ILD layer 124 is then applied using conventional thin film deposition techniques. The ILD layer 124 preferably is approximately 3500 Angstroms thick, and comprises silicon oxide. The ILD layer 124 is then selectively etched, as shown in FIG. 14, using conventional masking and etching processes, to provide access to the surface of the second conductive material layer 122 defining the upper electrode by an upper conductive grid interconnect 126. The upper conductive grid interconnect 126 may be formed by first applying a blanket deposition of conductive material using conventional thin film deposition processes and then by etching the conductive material to form the upper conductive grid interconnect 126 extending above the surface of the ILD layer 124, as shown in FIG. 15. The upper conductive grid interconnect 126 material may comprise materials such as, for example, Ti, TiN, or aluminum, and preferably will comprise aluminum.

Figure 16:
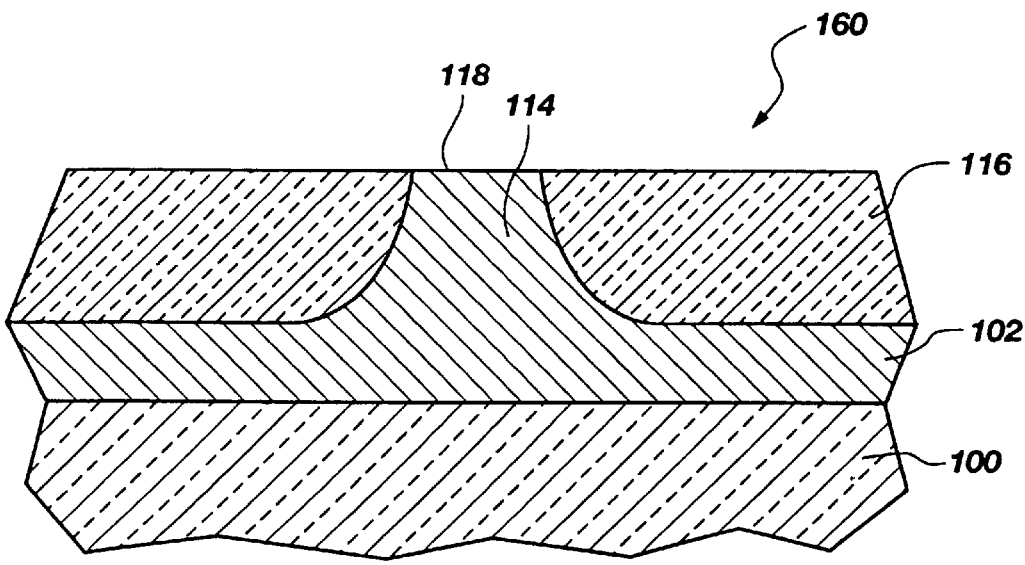
FIG. 16 is a side cross-sectional view, which is analogous to FIG. 9, illustrating an intermediate structure after planarization of the layer of the insulative material using a conventional CMP process.
Figure 17:
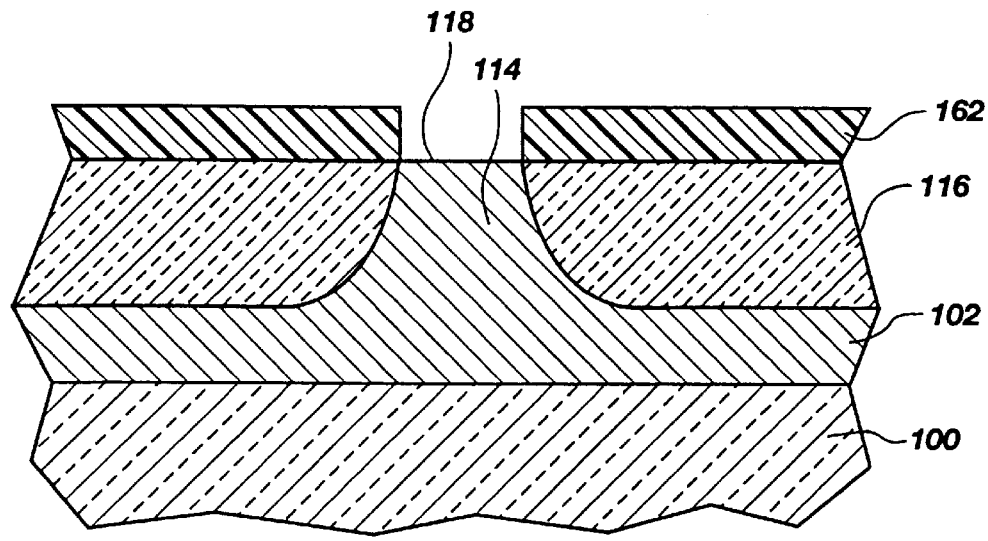
FIG. 17 is a side cross-sectional view of an etch mask formed over the insulative material layer.
Figure 18:
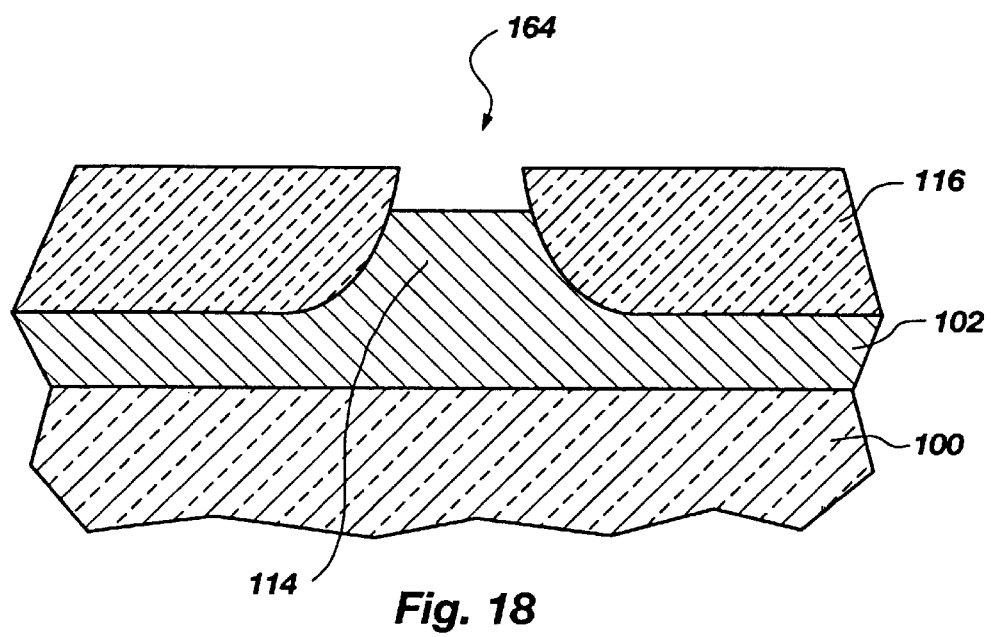
FIG. 18 is a side cross-sectional view of a recess formed by etching a portion of the frusto-conical shaped tip.

In an alternative embodiment shown in FIGS. 16–21, an intermediate structure 160 is fabricated by substantially the same method as described above and illustrated in FIGS. 1–9. Elements common to both FIGS. 1–15 and FIGS. 16–21 retain the same numeric designation. FIG. 16 illustrates an intermediate structure (analogous to FIG. 9) after planarization of the layer of the insulative material 116 using a conventional CMP process. As shown in FIG. 17, an etch mask 162 is applied over the insulative material layer 116 to expose the top surface 118 of the tip 114. The tip 114 is then etched to form a recess 164 in insulative material layer 116, as shown in FIG. 18. Preferably, the recess 164 is etched without a mask if an appropriate etchant selective between the insulative material layer 116 and the conductive material layer 102 of the tip 114 is used, such as wet etching using $NH_4OH/KOH$ or dry etching using $SF_6$.

Figure 19:
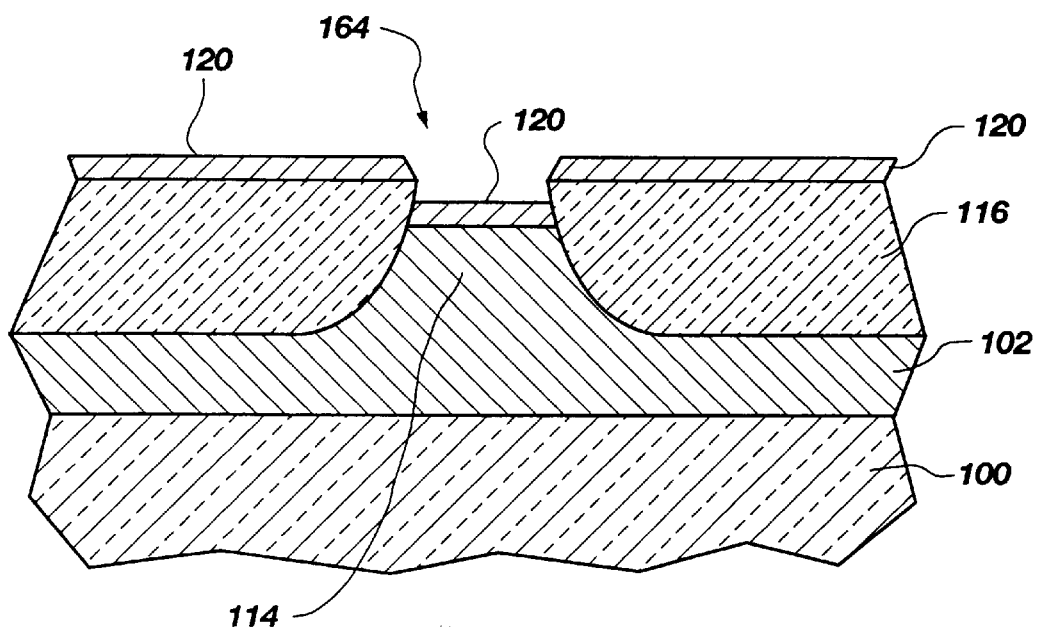
FIG. 19 is a side cross-sectional view of a chalcogenide material layer that is deposited using conventional thin film deposition methods.
Figure 20:
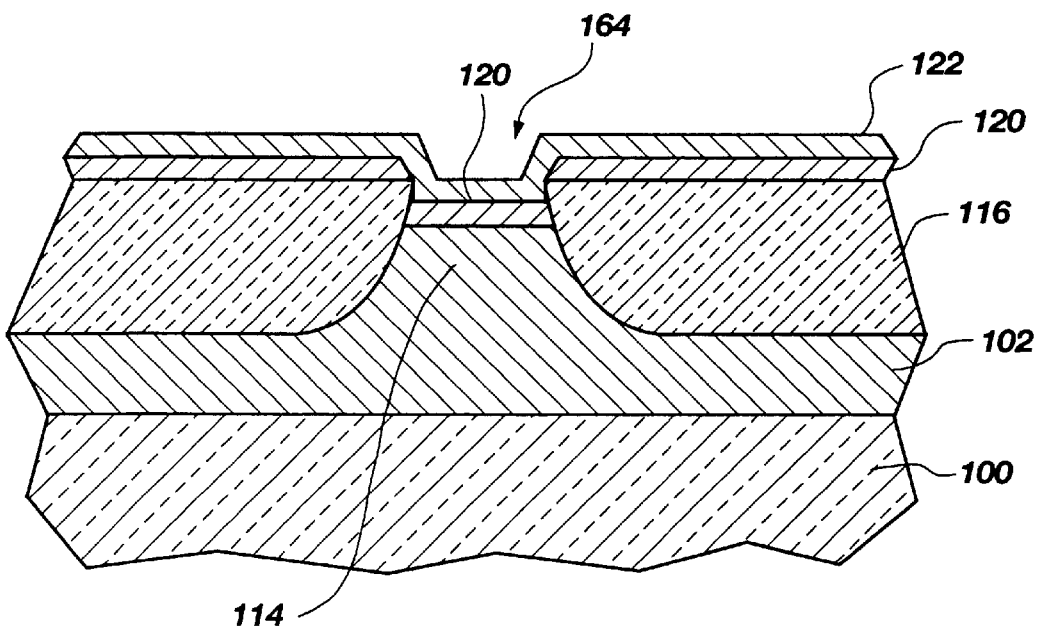
FIG. 20 is a side cross-sectional view of a layer of conductive material deposited over the chalcogenide layer using conventional thin film deposition techniques.
Figure 21:
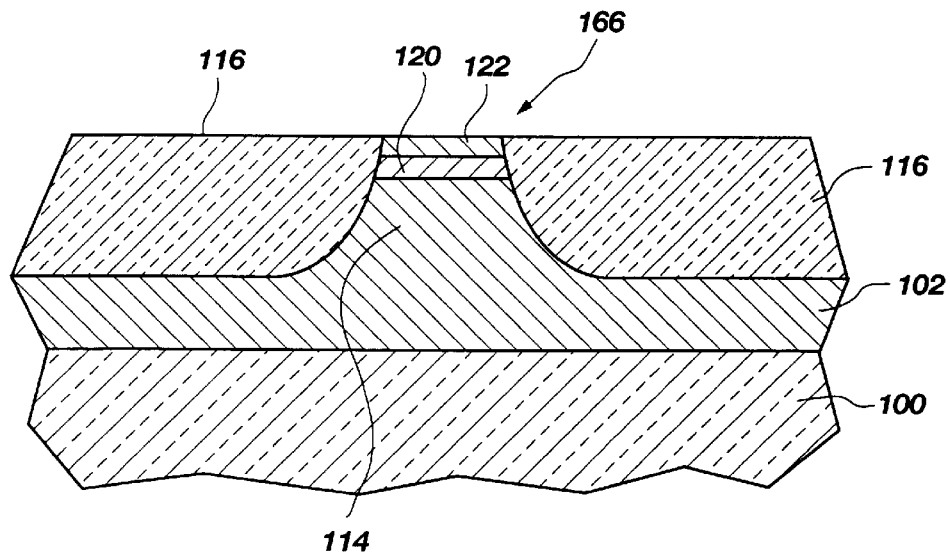
FIG. 21 is a side cross-sectional view of a resulting structure after planarization of the conductive material.

As shown in FIG. 19, the chalcogenide material layer 120 is applied over the insulative material layer 116 such that a portion is deposited as a layer of chalcogenide material 120 in the recess 164. A second conductive material layer 122 is deposited over the chalcogenide material layer 120 such that a portion extends into recess 164 to form the second conductive material layer 122 over the chalcogenide material layer 120, as shown in FIG. 20. The second conductive material layer 122 and chalcogenide material layer 120 over the insulative material layer 116 is then removed, preferably by a CMP process, to form a structure as shown in FIG. 21. An upper conductive grid interconnect 126 may then be formed by conventional techniques to contact the second conductive material layer 122, such as shown in the FIG. 15.

It is, of course, understood that the chalcogenide material layer 120 on the upper surface of the insulative material layer 116 can be removed, such as by CMP, prior to depositing the second conductive material layer 122. Furthermore, a carbon layer may be interposed between the chalcogenide material layer 120 and the second conductive material layer 122.

Figure 22:
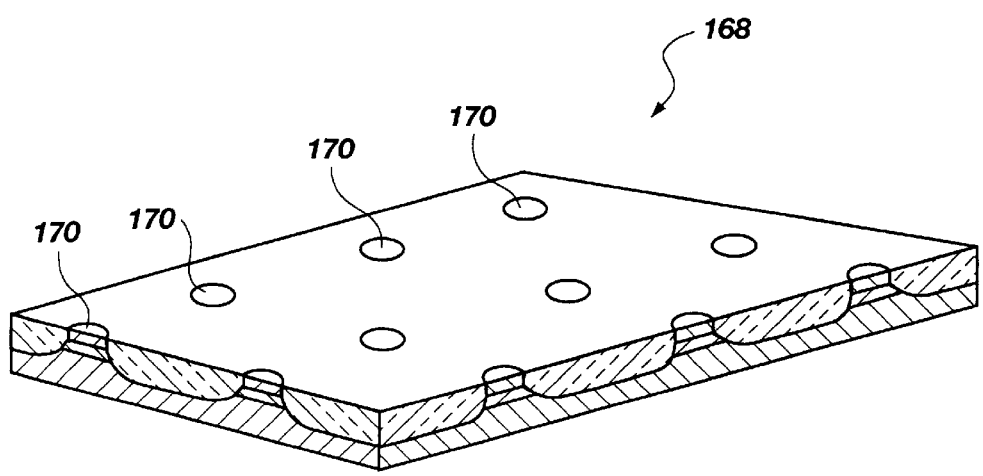
FIG. 22 is an oblique cross-sectional view of a memory cell array of the present invention.
Figure 23:
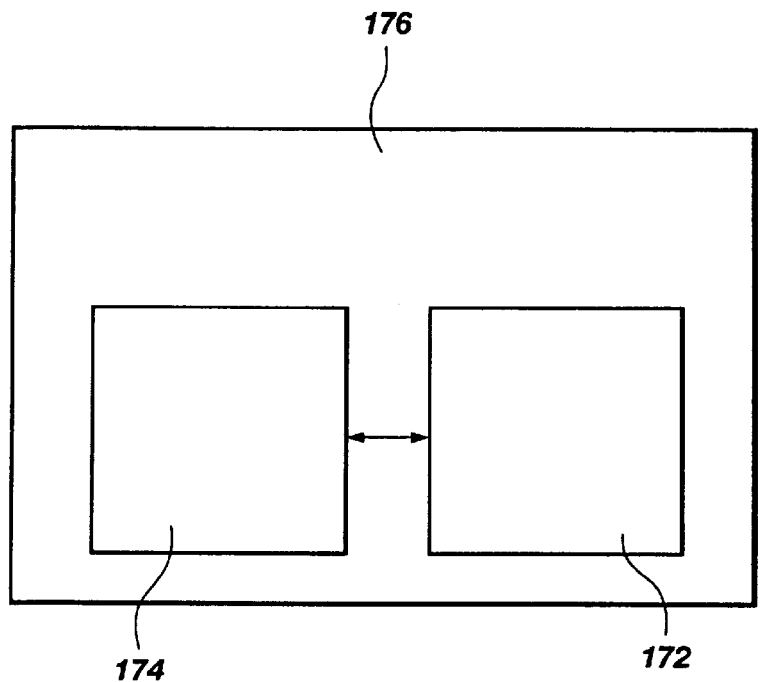
FIG. 23 is a schematic of a computer with a CPU and interacting RAM.

In a particularly preferred embodiment, the methods described above are utilized to form an array 168 of chalcogenide memory cells 170 that are addressable by an X-Y grid of upper and lower conductors, i.e., electrodes, as shown in FIG. 22. In the particularly preferred embodiment, diodes are further provided in series with the chalcogenide memory cells to permit read/write operations from/to individual chalcogenide memory cells 170, as will be recognized by persons of ordinary skill in the art. Thus, the chalcogenide memory cells 170 can be utilized in a memory chip 172 which interacts with a CPU (central processing unit) 174 within a computer 176, as schematically illustrated in FIG. 23.

Figure 24:
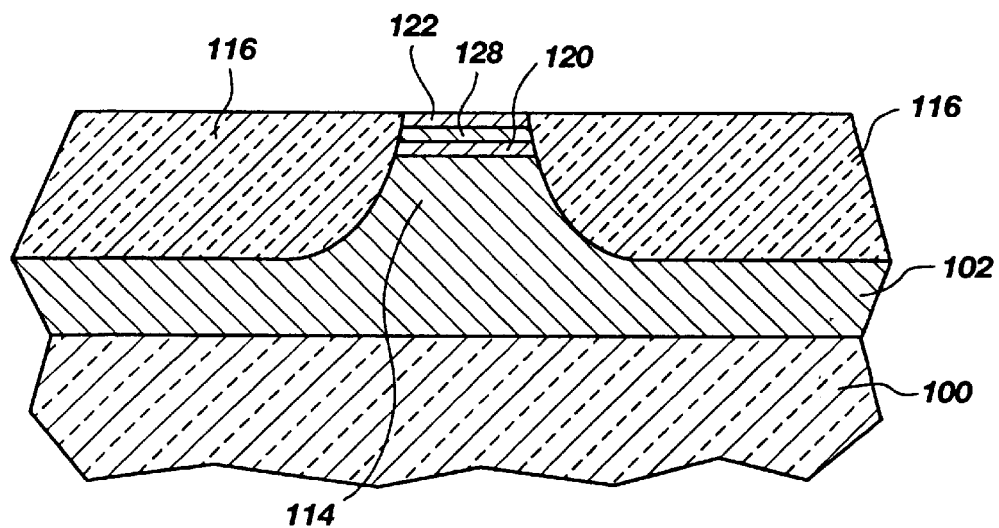
FIG. 24 is a side cross-sectional view of a resulting structure utilizing an optional conductive barrier layer between the conductive material and the chalcogenide material.

It is also understood that if a conductive barrier layer 128 is required between the chalcogenide material layer 120 and the second conductive material layer 122, a structure shown in FIG. 24 may be formed.

Figure 25:
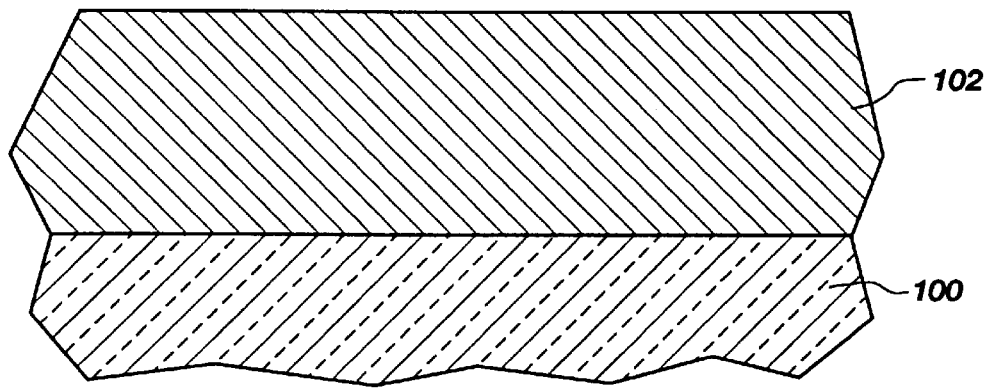
FIG. 25 is a side cross-sectional view of the deposition of a layer of polysilicon onto a substrate of titanium nitride in accordance with an alternate embodiment of the present invention for forming an intermediate structure.
Figure 26:
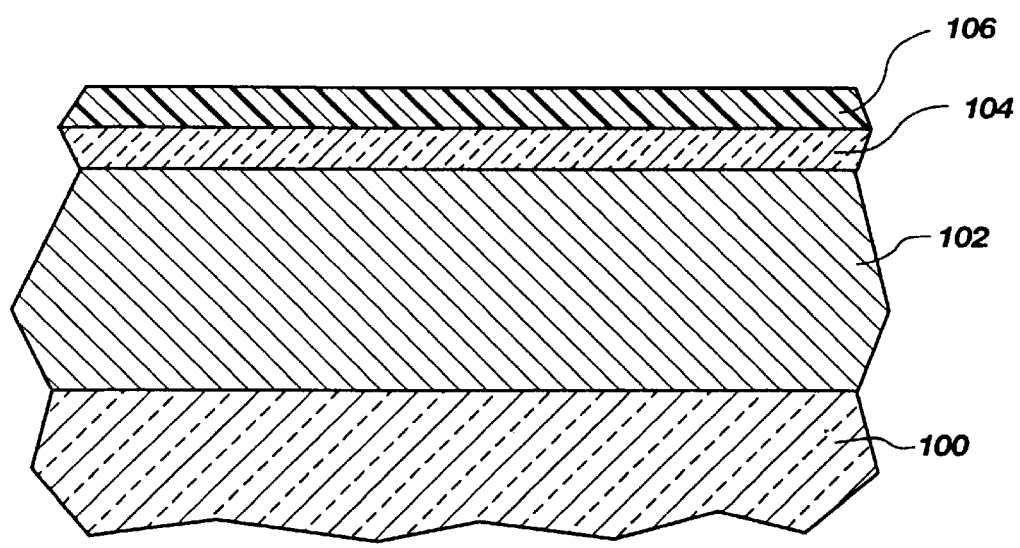
FIG. 26 is a side cross-sectional view of the deposition of a layer of silicon oxide and a layer of resist material onto the layer of polysilicon.
Figure 27:
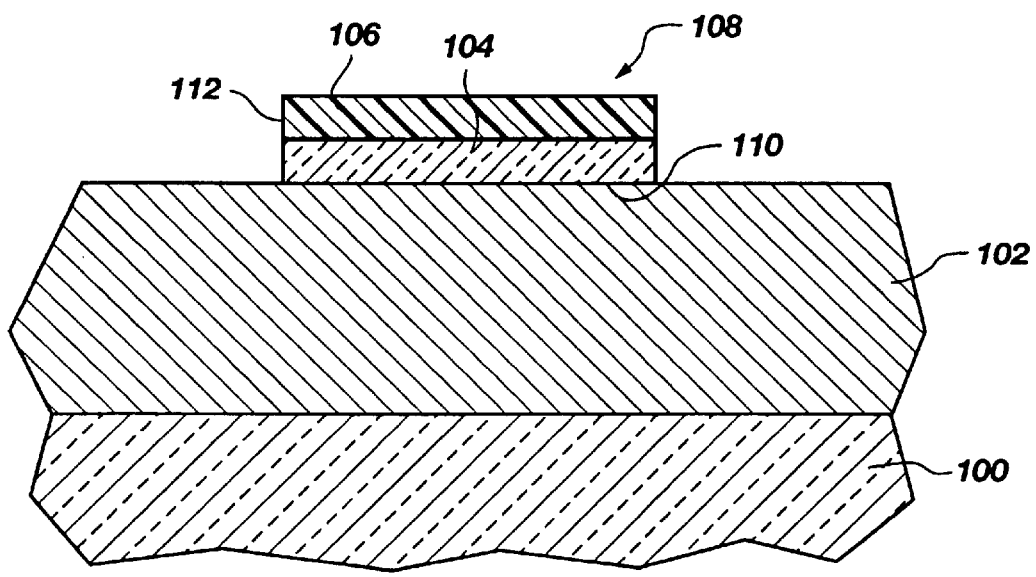
FIG. 27 is a side cross-sectional view of a contact pattern that is etched in the layer of resist material and the silicon oxide layer using etching, masking, and photoresist stripping techniques.

The intermediate structure 160 (FIGS. 9 and 16) may also be formed by an alternative method shown in FIGS. 25–32. Elements common to both FIGS. 1–9 and FIGS. 25–32 retain the same numeric designation. A layer of conductive material 102 is deposited onto a substrate 100, as illustrated in FIG. 25. A layer of silicon oxide 104 is deposited onto the substrate 100 and a layer of resist material 106 is applied onto the silicon oxide layer 104, as illustrated in FIG. 26. A contact pattern 108 is then etched in the resist material layer 106 and the silicon oxide layer 104, as shown in FIG. 27.

Figure 28:
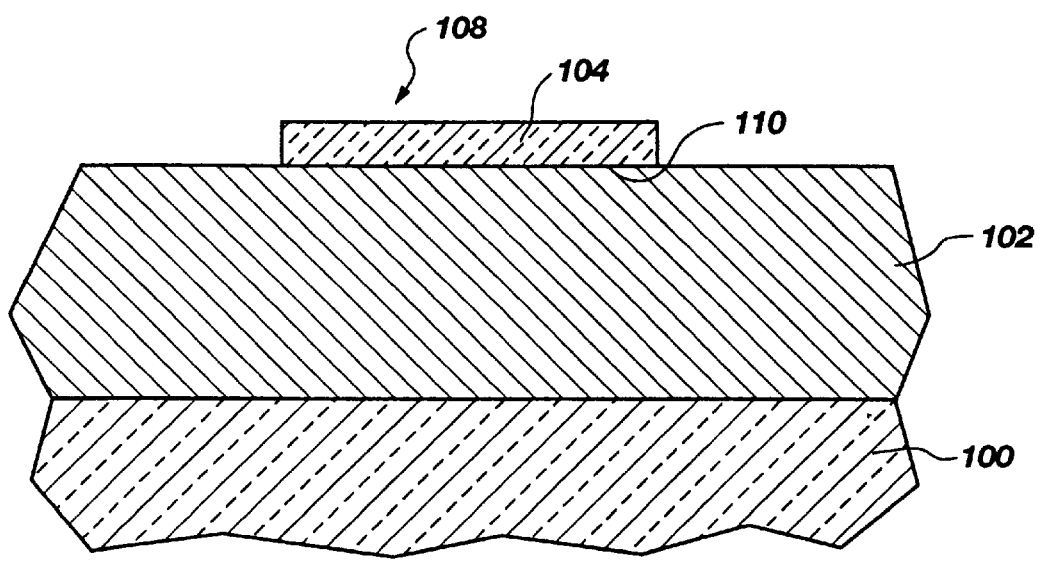
FIG. 28 is a side cross-sectional view of the device after the resist material layer has been stripped away using strip etching techniques.

After the contact pattern 108 has been patterned in the silicon oxide layer 104, the resist material layer 106 is then removed using conventional stripping techniques, as shown in FIG. 28. Thus, the silicon oxide layer 104 remains as the contact pattern 108. The silicon oxide layer 104 contact pattern is used as a masking layer when the conductive material layer 102 is subsequently etched.

Figure 29:
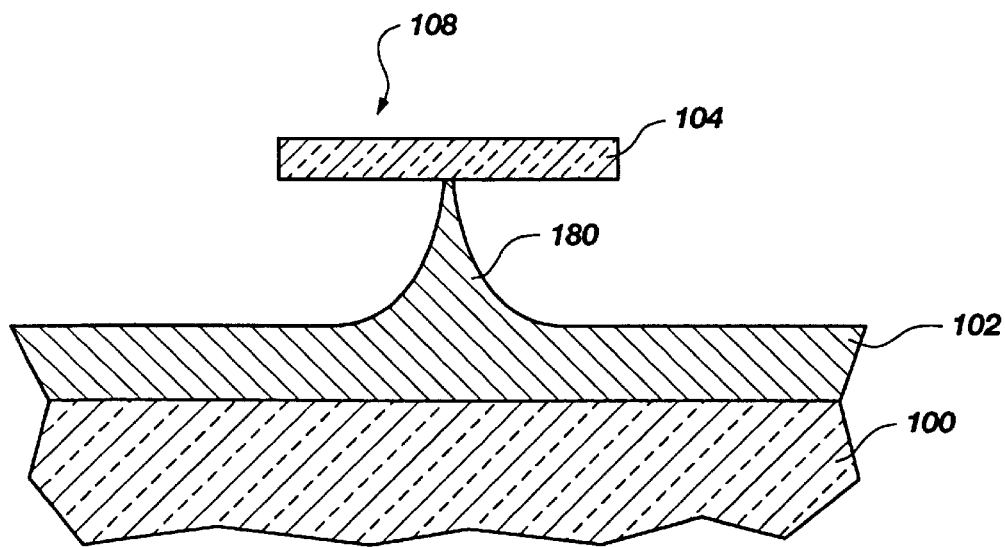
FIG. 29 is a side cross-sectional view of a portion of the layer of polysilicon material not covered by the silicon oxide layer pattern that is etched using conventional undercut isotropic etching techniques to form a sharp tip in the layer of polysilicon material.
Figure 30:
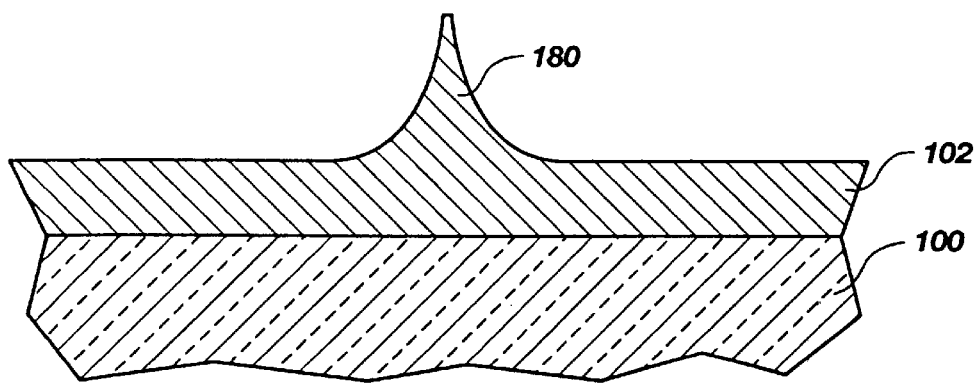
FIG. 30 is a side cross-sectional view of the device after the contact pattern has been removed using conventional wet etch techniques.
Figure 31:
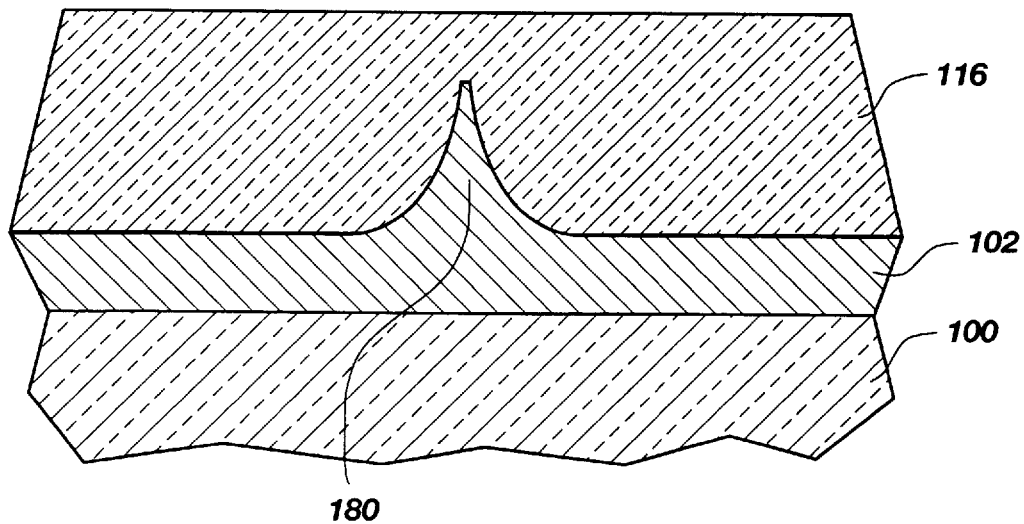
FIG. 31 is a side cross-sectional view of the depositing of a layer of insulative material onto the layer of polysilicon material, including the tip, using conventional thin film deposition methods to isolate the layer of polysilicon material, including the tip.
Figure 32:
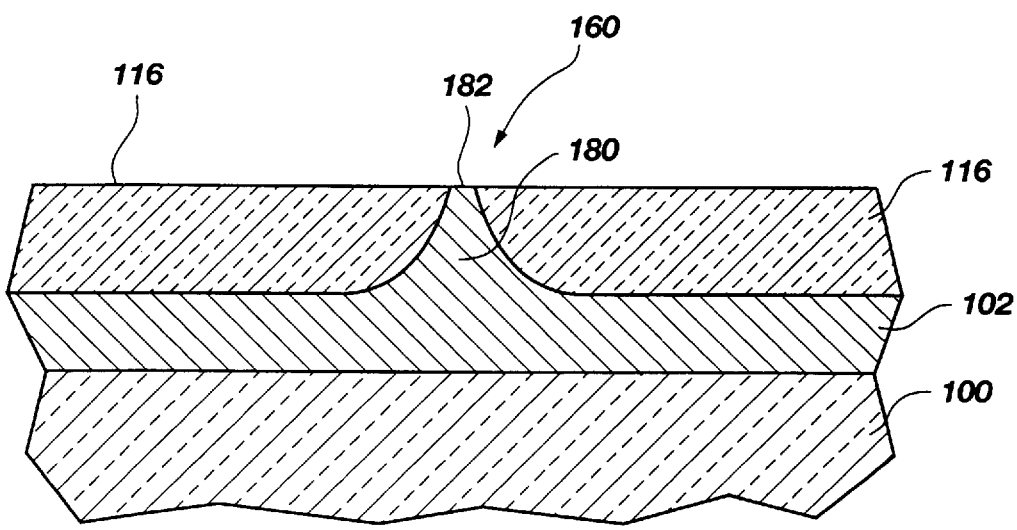
FIG. 32 is a side cross-sectional view of planarization of the layer of insulative material using a conventional chemical mechanical planarization (CMP) process.

The portion of the conductive material layer 102 not covered by silicon oxide layer pattern 104 is etched using wet etch or dry plasma etching techniques. The portions of conductive material layer 102 beneath silicon oxide pattern 104 being undercut to form a sharp tip 180 above the remaining exposed surface of the conductive material layer 102, as shown in FIG. 29. The silicon oxide pattern 104 is then removed, as shown in FIG. 30. A layer of insulative material 116 is deposited onto the conductive material layer 102 to a level above the sharp tip 180, as illustrated in FIG. 31. The insulative material layer 116 is then preferably planarized using a conventional abrasive technique such as a chemical mechanical planarization (CMP) process, as illustrated in FIG. 32, to form the intermediate structure 160. The CMP process is performed to level and expose a top surface 182 of the sharp tip 180 formed on the conductive material layer 102. This method allows for greater control of a surface area of top surface 182 of the sharp tip 180 by controlling the depth of the planarization. Once the intermediate structure 160, the chalcogenide memory cell may then be formed using the methods described above and shown in FIGS. 10–15 and FIGS. 16–21.

The present invention includes the simultaneous fabrication of a plurality of tips 114 on the lower electrode, i.e., the conductive material layer 102, such that a plurality of chalcogenide memory cells comprising an array may be created. The drawings show only a single tip 114 for ease of illustration of the present invention. Furthermore, while a range of materials may be utilized for each layer, the particular materials selected for each layer must be selected to provide proper selectivity during the various etching processes as will be recognized by persons of ordinary skill in the art.

Having thus described in detail preferred embodiments of the present invention, it is to be understood that the invention defined by the appended claims is not to be limited by particular details set forth in the above description, as many apparent variations thereof are possible without departing from the spirit or scope thereof.

What is claimed is:

1. A method for forming a memory cell, comprising:

providing a first conductive layer on a substrate;

forming at least one raised portion extending upwardly from said first conductive layer;

providing an insulative material on said first conductive layer and over said at least one raised portion extendly upwardly from said conductive layer;

removing a portion of said insulative material at least over said at least one raised portion extending upwardly from said first conductive layer to expose a top surface of said at least one raised portion extending upwardly from said first conductive layer;

etching said at least one raised portion extending upwardly from said first conductive layer downwardly from said top surface to form a recess in said insulative material;

depositing a programmable resistive material in said recess; and depositing a second conductive layer in said recess over said programmable resistive material.

2. The method of claim 1, wherein said programmable resistive material comprises a chalcogenide material.

3. The method of claim 2, wherein said chalcogenide material is selected from a group consisting of tellurium (Te), germanium (Ge), antimony (Sb), and combinations thereof.

4. The method of claim 3 wherein said chalcogenide material includes tellurium (Te), germanium (Ge), antimony (Sb) in a ratio $Te_a Ge_b Sb_{100-(a+b)}$, where a, b, and (100−(a+b)) are in atomic percentages which total 100% of constituent elements, a $\leq 70\%$ and $15\% \leq b \leq 50\%$.

5. The method of claim 4, wherein $40\% \leq a \leq 60\%$ and $17\% \leq b \leq 44\%$.

6. The method of claim 1, wherein said forming said at least one raised portion extending upwardly from said first conductive layer comprises:

forming a layer of oxide on said first conductive layer;

patterning said oxide layer to form spaced oxide elements; and etching said first conductive layer to form said at least one raised portion extending upwardly from said first conductive layer below each of said spaced oxide elements.

7. The method of claim 1, wherein said removing said portion of said insulative material at least over said at least one raised portion extending upwardly from said conductive layer to expose said top surface of said at least one raised portion extending upwardly from said first conductive layer comprises planarizing said insulative material.

8. The method of claim 1, wherein said removing said portion of said insulative material at least over said at least one raised portion extending upwardly from said first conductive layer to expose said top surface of said at least one raised portion extending upwardly from said first conductive layer comprises planarizing said insulative material and an upper portion of said at least one raised portion extending upwardly from said first conductive layer.

9. The method of claim 1, wherein said depositing said programmable resistive material further comprises isolating said programmable resistive material within said recess.

* * * * *

UNITED STATES PATENT AND TRADEMARK OFFICE
CERTIFICATE OF CORRECTION

PATENT NO. : 6,150,253
DATED : November 21, 2000
INVENTOR(S) : Trung T. Doan, D. Mark Durcan and Brent D. Gilgen It is certified that error appears in the above-identified patent and that said Letters Patent is hereby corrected as shown below:

<u>Title page,</u>
Item [63], Related U.S. Application Data, after "October 2, 1996, insert -- now U.S. Patent No. 6,147,395 issued on November 14, 2000 --

<u>Column 2,</u>
Line 14, after "current required" insert -- and --

<u>Column 5,</u>
Line 4, after "present invention;" delete "and"

<u>Column 7,</u>
Line 6, after "silicon oxide" insert -- layer --
Line 23, after "that" insert -- a --
Line 23, after "is" insert -- to --

<u>Column 9,</u>
Line 9, after "structure" insert -- 166 --

<u>Column 10,</u>
Line 37, change "from said conductive layer" to -- from said first conductive layer -- (third occurrence)

<u>Column 11,</u>
Line 10, change "from said conductive layer" to -- from said first conductive layer --

Signed and Sealed this

Twenty-sixth Day of November, 2002

*Attest:*

JAMES E. ROGAN
*Attesting Officer*     *Director of the United States Patent and Trademark Office*